United States Patent
Wu et al.

(10) Patent No.: US 8,937,388 B2
(45) Date of Patent: Jan. 20, 2015

(54) METHODS AND APPARATUS OF PACKAGING SEMICONDUCTOR DEVICES

(75) Inventors: Yi-Wen Wu, Xizhi (TW); Ming-Che Ho, Tainan (TW); Wen-Hsiung Lu, Johonghe (TW); Chia-Wei Tu, Chubei (TW); Chung-Shi Liu, Hsin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/492,285

(22) Filed: Jun. 8, 2012

(65) Prior Publication Data

US 2013/0328190 A1    Dec. 12, 2013

(51) Int. Cl.
*H01L 23/52*    (2006.01)

(52) U.S. Cl.
USPC .......................................................... 257/738

(58) Field of Classification Search
CPC ............ H01L 23/498; H01L 23/49811; H01L 23/49816; H01I 24/10; H01I 24/81
USPC .......... 257/750, 758, 734, 737, 738, E21.575, 257/E21.582, E23.153, E23.167; 438/618, 438/622, 637, 642
See application file for complete search history.

(56) References Cited

U.S. PATENT DOCUMENTS

| 5,929,521 A * | 7/1999 | Wark et al. ................... 257/737 |
| 2004/0183209 A1* | 9/2004 | Lin .............................. 257/778 |
| 2008/0308934 A1* | 12/2008 | Alvarado et al. ............ 257/738 |
| 2010/0244269 A1 | 9/2010 | Kim |

FOREIGN PATENT DOCUMENTS

| KR | 20100109242 | 10/2010 |
| KR | 101059625 | 8/2011 |

* cited by examiner

Primary Examiner — Yu-Hsi D Sun
Assistant Examiner — Christina Sylvia
(74) Attorney, Agent, or Firm — Slater & Matsil, L.L.P.

(57) ABSTRACT

Methods and apparatuses for wafer level packaging (WLP) of semiconductor devices are disclosed. A contact pad of a circuit may be connected to a solder bump by way of a post passivation interconnect (PPI) line and a PPI pad. The PPI pad may comprise a hollow part and an opening. The PPI pad may be formed together with the PPI line as one piece. The hollow part of the PPI pad can function to control the amount of solder flux used in the ball mounting process so that any extra amount of solder flux can escape from an opening of the solid part of the PPI pad. A solder ball can be mounted to the PPI pad directly without using any under bump metal (UBM) as a normal WLP package would need.

20 Claims, 2 Drawing Sheets

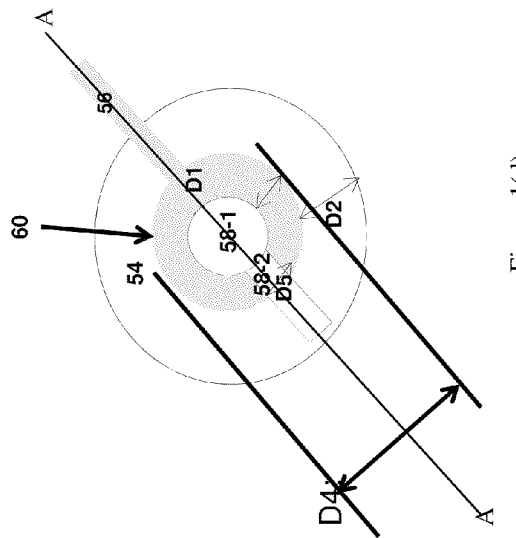
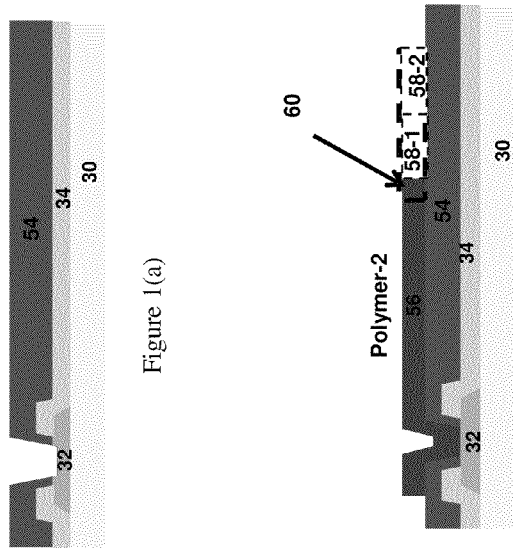
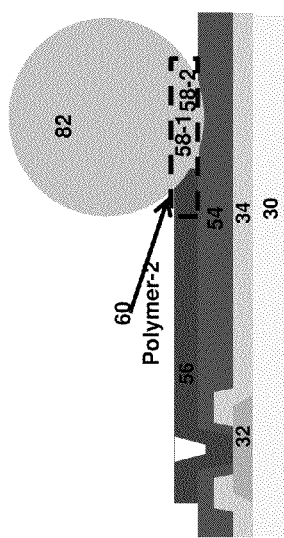
Figure 1(a)
Figure 1(b)
Figure 1(c)
Figure 1(d)

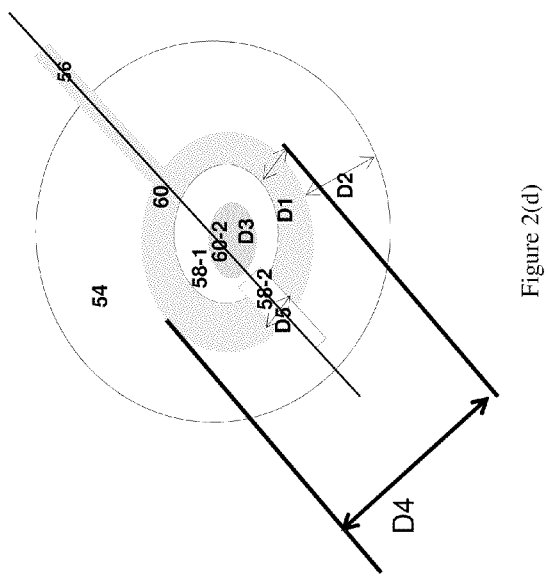
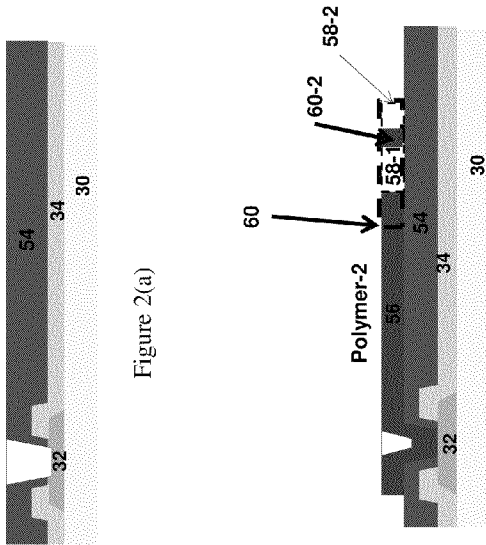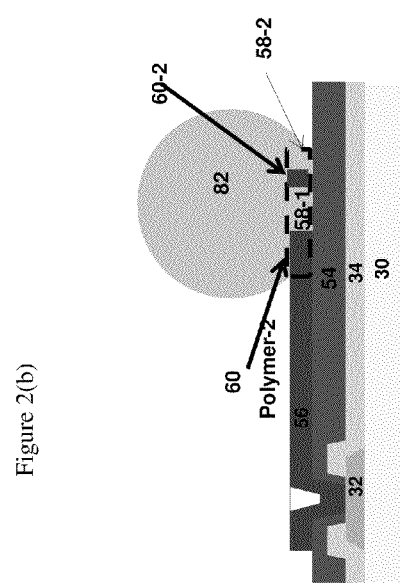

METHODS AND APPARATUS OF PACKAGING SEMICONDUCTOR DEVICES

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed is the wafer level package (WLP), in which integrated circuits are packaged in packages that typically include a redistribution layer (RDL) or post-passivation interconnect (PPI) that is used to fan out wires for contact pads of the circuit so that electrical contacts can be made on a larger pitch than contact pads of the circuit.

WLP packages have been applied more and more in integrated circuit packaging due to the advantages of cost and simple structure. However, the standard manufacture process for WLP is expensive, which may need four photo masks. In addition, non-optimized solder flux amount used during the mounting of the solder balls on the RDL or the PPI on the wafer can cause the solder balls not to be firmly connected. Methods and systems to solve those problems are needed.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(a)-1(d) illustrate an embodiment of a WLP process with an improved post-passivation interconnect design, shown in cross-sectional view or in top view; and FIGS. 2(a)-2(d) illustrate another embodiment of a WLP process with an improved post-passivation interconnect design, shown in cross-sectional view or in top view.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the embodiments, and do not limit the scope of the disclosure.

Methods and apparatus for wafer level packaging (WLP) are disclosed. A contact pad of a circuit may be connected to a solder bump by way of a post passivation interconnect (PPI) line and a PPI pad, where the PPI pad has an improved design. The PPI pad may comprise a hollow part and an opening. The hollow part of the PPI pad can function to control the amount of solder flux used in the ball mounting process so that any extra amount of solder flux can escape from the opening of the PPI pad. A solder ball can be mounted on the PPI pad directly without using any under bump metal (UBM) as a normal WLP package would need, thereby reducing the cost while improving the bonding performance.

Wafer level packages (WLP) are commonly used with integrated circuits (ICs) demanding high speed, high density, and greater pin count. FIGS. 1(a)-1(d) illustrate an embodiment of a WLP process with an improved PPI pad design, shown in cross-sectional view or in top view.

Illustrated in FIG. 1(a), an IC 30 or a circuit 30 may be formed on a substrate which is made of silicon or other bulk semiconductor material. The IC 30 may be a part of a base semiconductor wafer, which contains additional semiconductor IC not shown. The IC 30 contains active and passive devices, conductive layers, and dielectric layers according to the electrical design of the circuit. The length of the circuit 30 is only for illustrative purposes and may not be drawn to scale. The illustrative process shown in FIGS. 1(a)-1(d) for the circuit 30 applies to the packaging of other circuits on the same wafer the circuit 30 is on. The process is only illustrated for the connection of one contact pad of the circuit 30 with one solder ball/bump through a post-passivation interconnect (PPI) line and PPI pad as shown in FIG. 1(c). The PPI line and pad may be called a redistribution layer (RDL). The circuit 30 may comprise a plurality of contact pads connected to a plurality of solder ball/bumps through a network of PPI lines and PPI pads according to its functional design. The electrical signals from the circuit 30 are routed through the network of PPI lines and PPI pads to one or more of the solder bumps according to the function of the semiconductor device.

A conductive layer is formed as a contact pad 32 using a patterning and deposition process. The circuit 30 may have a plurality of contact pads 32 on a surface thereof. The contact pad 32 may be made with aluminum (Al), copper (Cu), tin (Sn), nickel (Ni), gold (Au), silver (Ag), or other electrically conductive material. The deposition of the contact pad 32 uses an electrolytic plating or electroless plating process. The size, shape, and location of the contact pad 32 are only for illustration purposes and are not limiting. The plurality of contact pads of the circuit 30, which are not shown, may be of the same size or of different sizes.

A passivation layer 34 may be formed over the surface of the circuit 30 and on top of the contact pad 32 for structural support and physical isolation. The passivation layer 34 can be made with silicon nitride (SiN), silicon dioxide (SiO2), silicon oxynitride (SiON), polyimide (PI), benzocyclobutene (BCB), polybenzoxazole (PBO), or other insulating material. An opening of the passivation layer 34 may be made by removing a portion of passivation layer 34 using a mask-defined photoresist etching process to expose a portion of the contact pad 32 while still covering other portion of the contact pad 32. The size, shape, and location of the opening made are only for illustration purposes and are not limiting.

A polymer layer 54 may be formed on the passivation layer 34, following the contour of the passivation layer 34, filling a part of the opening of the passivation layer 34 over the contact pad 32. The polymer layer 54 may not completely fill the opening of the passivation layer 34 over the contact pad 32, instead it may be patterned to form an opening to expose a part of the contact pad 32, while covering the rest of the contact pad 32. The patterning of the polymer layer 54 may include photolithography techniques. The polymer layer 54 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the polymer layer 54 may be between about 5 μm and about 30 μm, for example. The dimensions recited throughout the description are merely examples, and will change with the down-scaling of integrated circuits.

As illustrated in FIG. 1(b), a metal material is used to form a post passivation interconnect (PPI) line 56 on the polymer layer 54, following the contour of the polymer layer 54. The PPI line 56 is further connected to a PPI pad 60 as shown in FIG. 1(b). In one embodiment, the connection between the PPI line 54 and the PPI pad 60 may be smooth without interruption, which makes the two as one piece. The PPI pad 60 comprises a hollow part 58-1 and an opening 58-2, in FIG. 1(b) shown in cross-section view. Having an opening 58-2 for the PPI pad 60 controls the amount of solder flux so that solder flux cannot overflow, therefore providing the right amount of solder flux for bounding the solder ball. If the solder flux is overflown, the overflown solder flux will flow out of the PPI pad 60 from the opening 58-2.

More details of the PPI pad 60 and its connection to the PPI line 56 are shown in FIG. 1(d) in top view. The PPI line 56 is a line extending over the contact pad 32. The PPI line 56 fills the opening of the polymer layer 54, and contacts the contact pad 32. Therefore the PPI line 56 forms an electrical connection with the contact pad 32. The PPI line 56 may have a narrow, wide, or tapered shape. The PPI line 56 may be of a substantially constant thickness and width. The PPI line 56 terminates at the PPI pad 60, therefore the body of the PPI line 56 and the PPI pad 60 may be formed as one piece.

The PPI pad 60 is used to connect to a solder ball forming a connection between the contact pad 32 to a solder ball by way of the PPI line 56 and the PPI pad 60. The PPI pad 60 comprises a hollow part 58-1 and an opening 58-2. A solder ball/bump may be mounted on the hollow part 58-1 and in touch with the PPI pad 60 so that an electrical connection can be made between the solder ball and the PPI pad 60. A solder ball may have a diameter bigger than the diameter or the width of the hollow part 58-1 as well.

As illustrated in FIG. 1(d), PPI pad 60 may be of an annular shape that encircles a hollow part 58-1, with an opening 58-2. The hollow part 58-1 and the opening 58-2 are connected to form one connected part. In three dimensions, they form a cavity to house the solder flux. The PPI pad 60 may have other shapes such as a rectangle or a square. The PPI pad 60 may be of an annular shape with an outer diameter D4 of a size ranging from about 180 um to about 260 um, for example. The PPI pad 60 may be of an annular shape with a width of a size D1 ranging from about 10 um to about 130 um, for example. The opening 58-2 of the PPI pad 60 may be of a size, which may be the length, D5 ranging from about 10 um to about 50 um, for example. The hollow part 58-1 may be of a shape as a circle, a rectangle, or a square, or some other shapes.

The PPI pad 60 may stop somewhere before reaching the end of the polymer layer 54. As shown in FIGS. 1(b) and 1(d), the distance between the terminal of the polymer layer 54 and the edge of the PPI pad 60 is about a size D2. The size D2 can be very flexible in making the connection.

Referring back to FIG. 1(b), the height of the PPI line 56 and the PPI pad 60 are only shown for illustrative purposes and not limiting. The PPI line 56 and the PPI pad 60 may have a height of less than about 30 μm, e.g. between about 2 μm and about 10 μm, or in a range of 0.5 KA to 3 KA, for example. The PPI line 56 and the PPI pad may be made with, e.g., Ti, Al, Ni, nickel vanadium (NiV), Cu, or a Cu alloy. The formation methods include electrolytic plating, electroless plating, sputtering, chemical vapor deposition methods, and the like. The PPI line 56 and the PPI pad 60 can be made with a single layer, or multiple layers using an adhesion layer of Ti, TiW, or Cr, for example. The circuit 30 is connected to a number of PPI lines 56 and the PPI pads 60 to form a network of PPI lines and the PPI pads which may electrically connect to the contact pads of the circuit 30 according to the function of the semiconductor device.

A solder flux (not shown) may be applied to the PPI line 56 and the PPI pad 60. The flux serves primarily to aid the flow of the solder, such that the solder ball 82 shown in FIG. 1(c) makes a good contact with PPI pad 60. It may be applied in any of a variety of methods, including brushing or spraying. The flux generally has an acidic component, which removes oxide barriers from the solder surfaces, and an adhesive quality, which helps to prevent the chip from moving on the substrate surface during the assembly process. Among fluxes used in the related art, those containing rosin as the primary constituent are the best known. Rosin contains a carboxylic acid such as abietic acid or levopimaric acid, and the carboxyl group acts to remove the oxide film at the surface of the metal to be soldered.

As illustrated in FIG. 1(c), a solder connector 82, which may be a solder bump or a solder ball, is placed onto the PPI pad 60 on top of the hollow part 58-1. The use of the word "solder" in this application includes without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications. For lead-free solder, SAC solders of varying compositions may be used, such as SAC 105 (Sn 98.5%, Ag 1.0%, Cu 0.5%), SAC 305, SAC 405 and the like. Lead-free solder connectors such as solder balls may be formed from SnCu compounds as well, without the use of silver (Ag). Alternatively, lead-free solder connectors may include tin and silver, Sn—Ag, with any copper. The solder connector 82 may be one among an array of the solder balls formed as a grid, referred to as a "ball grid array" or "BGA". However, the embodiments described herein are not limited to BGA packages or BGA balls. The embodiments are not limited to the spherical or ball shapes for the solder connectors.

FIG. 1(c) illustrates a cross-section view of a solder ball 82 mounted on top of the circuit 30. The solder ball 82 can be mounted to the PPI pad 60 directly without using any under bump metal (UBM) as a normal WLP package would need, therefore reducing the cost while improving the bonding performance. The contact pad 32 is connected to the PPI line 56 and PPI pad 60, which is further connected to the solder ball 82. The process shown in FIGS. 1(a)-1(d) is only for illustration purposes, and is not limiting. There may be many variations of processing steps and processing materials that can be readily seen by those skilled in the art.

FIGS. 2(a)-2(d) illustrate another embodiment of a WLP process with an improved post-passivation interconnect design, shown in cross-sectional view or in top view.

Illustrated in FIG. 2(a), a circuit 30 is formed on a substrate which is made of silicon or other bulk semiconductor material. A conductive layer is formed as a contact pad 32 using a patterning and deposition process. The circuit 30 may have a plurality of contact pads 32. A passivation layer 34 may be formed over the circuit 30 and on top of the contact pad 32 for structural support and physical isolation. An opening of the passivation layer 34 may be made by removing a portion of passivation layer 34 using a mask-defined photoresist etching process to expose a portion of the contact pad 32. A polymer layer 54 may be formed on the passivation layer 34, following the contour of the passivation layer 34, filling a part of the opening of the passivation layer 34 over the contact pad 32. The polymer layer 54 may not completely fill the opening of the passivation layer 34 over the contact pad 32, instead it may be patterned to form an opening to expose part of the contact pad 32. More details of FIG. 2(a) are the same as the details for FIG. 1(a).

As illustrated in FIG. 2(b), a metal material is used to form a post passivation interconnect (PPI) line 56 on the polymer layer 54, following the contour of the polymer layer 54. The PPI line 56 is further connected to a PPI pad 60 as shown in FIG. 2(b). In one embodiment, the connection between the PPI line 54 and the PPI pad 60 is smooth without interruption, which makes the two as one piece.

The PPI pad 60 shown in FIG. 2(b) comprises a hollow part 58-1, an opening 58-2, and a solid part 60-2, shown in cross-section view. Having an opening 58-2 for the PPI pad 60 controls the amount of solder flux so that solder flux cannot overflow, therefore providing the right amount of solder flux for bounding the solder ball. If the solder flux is overflown, the overflown solder flux will flow out of the PPI pad 60 from the opening 58-2.

More details of the PPI pad 60 and its connection to the PPI line 56 are shown in FIG. 2(d) in top view. The PPI line 56 may be a line extending over the contact pad 32. The PPI line 56 fills the opening of the polymer layer 54, and is in contact with the contact pad 32. Therefore the PPI line 56 forms an electrical connection with the contact pad 32. The PPI line 56 may have a narrow, wide, or tapered shape. The PPI line 56 may be of a substantially constant thickness and width. In one embodiment, the PPI line 56 terminates at the PPI pad 60, therefore the body of the PPI line 56 and the PPI pad 60 are formed as one piece.

The PPI pad 60 is used to connect to a solder ball, therefore forming a connection between the contact pad 32 to a solder ball by way of the PPI line 56 and the PPI pad 60. The PPI pad 60 comprises a hollow part 58-1, an opening 58-2, and a solid part 60-2, shown in top view in FIG. 2(d). A solder ball/bump may be mounted on the hollow part 58-1 and in touch with the PPI pad 60 so that an electrical connection can be made between the solder ball and the PPI pad 60. A solder ball may have a diameter bigger than the diameter or the width of the hollow part 58-1.

As illustrated in FIG. 2(d), PPI pad 60 may be of an annular shape with an opening 58-2 and it encircles the hollow part 58-1. The PPI pad 60 may have other shapes such as a rectangle or a square. The PPI pad 60 may be of an annular shape with an outer diameter D4 of a size ranging from about 180 um to about 260 um, for example. The PPI pad 60 may be of an annular shape with a width of a size D1 ranging from about 10 um to about 130 um, for example. The opening 58-2 of the PPI pad 60 may be of a size, which may be the length, D5 ranging from about 10 um to about 50 um, for example. The hollow part 58-1 may be of a shape as a circle, a rectangle, or a square, or some other shapes.

As illustrated in FIG. 2(d), the hollow part 58-1 may be at the center of the PPI pad 60. The hollow part 58-1 and the opening 58-2 are connected to form one connected area. In three dimensions, they form a cavity to house the solder flux.

As illustrated in FIG. 2(d), the solid part 60-2 of the PPI pad 60 may be a circle placed within the hollow part 58-1. The solid part 60-2 may have other shapes such as a rectangle or a square. The solid part 60-2 may be a circle with a diameter D3 of a size from about 10 um to about 160 um. The solid part 60-2 may be placed in the center of the hollow part 58-1. The solid part 60-2 may be disconnected from the PPI pad 60. In some embodiment, the solid part 60-2 may be connected to the PPI pad 60. The PPI pad 60 and the solid part 60-2 may be of different shapes.

The PPI pad 60 comprising a hollow part 58-1, an opening 58-2, and a solid part 60-2, may stop somewhere before reaching the end of the polymer layer 54. As shown in FIGS. 2(b) and 2(d), the distance between the terminal of the polymer layer 54 and the edge of the PPI pad 60 is about a size D2. The size D2 can be very flexible in making the connection.

The PPI pad 60 shown in FIG. 2(d) is only for illustration purpose and is not limiting. There may be more than one solid part located within the hollow part 58-1. The solid part 60-2 may be connected or disconnected to the PPI pad 60. As long as the outer perimeter of the PPI pad 60 has an opening so that solder flux can escape, and the PPI pad 60 has a cavity used to enclose a certain amount of solder flux, it would be an alternative PPI pad design.

Referring back to FIG. 2(b), the height of the PPI line 56 and the PPI pad 60 are only shown for illustrative purposes and not limiting. The PPI line 56 and the PPI pad 60 may have a height of less than about 30 μm, e.g. between about 2 μm and about 10 μm, or in a range of 0.5 KA to 3 KA, for example. The PPI line 56 and the PPI pad 60 may be made with, e.g., Ti, Al, Ni, nickel vanadium (NiV), Cu, or a Cu alloy. The formation methods include electrolytic plating, electroless plating, sputtering, chemical vapor deposition methods, and the like. The PPI line 56 and the PPI pad 60 can be made with a single layer, or multiple layers using an adhesion layer of Ti, TiW, or Cr, for example. The circuit 30 is connected to a number of PPI lines 56 and the PPI pads 60 to form a network of PPI lines and the PPI pads which may electrically connect to the contact pads of semiconductor circuit 30 according to the function of the semiconductor device.

A solder flux (not shown) may be applied to the PPI line 56 and the PPI pad 60. The flux serves primarily to aid the flow of the solder, such that the solder ball 82 shown in FIG. 1(c) makes a good contact with PPI pad 60. It may be applied in any of a variety of methods, including brushing or spraying. The flux generally has an acidic component, which removes oxide barriers from the solder surfaces, and an adhesive quality, which helps to prevent the chip from moving on the substrate surface during the assembly process.

As illustrated in FIG. 2(c), a solder connector 82, which may be a solder bump or a solder ball, is placed onto the PPI pad 60 on top of the hollow part 58-1. The use of the word "solder" in this application includes without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications. The solder connector 82 may be one among an array of the solder balls formed as a grid, referred to as a "ball grid array" or "BGA". However, the embodiments described herein are not limited to BGA packages or BGA balls. The embodiments are not limited to the spherical or ball shapes for the solder connectors.

FIG. 2(c) illustrates a cross-section view of a solder ball 82 mounted on top of semiconductor device 30. The contact pad 32 is connected to the PPI line 56 and PPI pad 60, which is further connected to the solder ball 82. The process shown in FIGS. 2(a)-2(d) is only for illustration purposes, and is not limiting. There may be many variations of processing steps and processing materials that can be readily seen by those skilled in the art.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package device, comprising:
a contact pad on a surface of a circuit;
a passivation layer over the surface of the circuit and a first portion of the contact pad, wherein a second portion of the contact pad remains exposed;
a post passivation interconnect (PPI) line on the passivation layer in contact with the second portion of the contact pad; and
a PPI pad connected to the PPI line, the PPI pad made of a conductive material comprising a solid part surrounding a hollow part, the solid part having an opening connected to the hollow part, the solid part having a topmost surface that is substantially planar with a topmost surface of the PPI line.

2. The device of claim 1, further comprising a polymer layer between the passivation layer and the PPI line and the PPI pad.

3. The device of claim 1, further comprising a solder ball over the hollow part of the PPI pad and in contact with the PPI pad.

4. The device of claim 1, wherein the PPI pad and the PPI line and the opening are all co-planar.

5. The device of claim 1, wherein the PPI pad is of an annular shape, a rectangle shape, or a square shape.

6. The device of claim 1, wherein the PPI pad is of an annular shape with an outer diameter ranging from about 180 um to about 260 um.

7. The device of claim 1, wherein the PPI pad is of an annular shape with a width of a size ranging from about 10 um to about 130 um.

8. The device of claim 1, wherein the opening of the PPI pad has a length ranging from about 10 um to about 50 um.

9. The device of claim 1, wherein the hollow part of the PPI pad is a circle shape, a rectangle shape, or a square shape.

10. The device of claim 1, wherein the PPI pad further comprises a second solid part within the hollow part.

11. The device of claim 10, wherein the second solid part is a circle shape, a rectangle shape, or a square shape.

12. The device of claim 10, wherein the second solid part is a circle with a diameter ranging from about 10 um to about 160 um.

13. The device of claim 10, wherein the second solid part is placed at a center of the hollow part of the PPI.

14. The device of claim 1, wherein the PPI pad is substantially planar wherein the solid part of the PPI pad is substantially planar.

15. A method for forming a package device comprising:
providing a circuit with a contact pad on a surface of the circuit;
forming a passivation layer on the surface of the circuit and a first portion of the contact pad, with a second portion of the contact pad exposed;
forming a post passivation interconnect (PPI) line on the passivation layer in contact with the second portion of the contact pad; and
forming a PPI pad connected to the PPI line, the PPI pad made of a conductive material comprising a solid part surrounding a hollow part, the solid part having an opening connected to the hollow part, wherein the PPI pad and the PPI line are formed at a same time as one piece.

16. The method of claim 15, further comprising:
forming a polymer layer between the passivation layer and the PPI line and the PPI pad.

17. The method of claim 15, further comprising:
placing a solder ball over the hollow part of the PPI pad and in contact with the PPI pad.

18. The method of claim 15, further comprising:
forming a second solid part of the PPI pad within the hollow part.

19. The method of claim 15, wherein the PPI pad is of an annular shape with an outer diameter ranging from about 180 um to about 260 um.

20. A package device, comprising:
a contact pad on a surface of a circuit;
a passivation layer over the surface of the circuit and a first portion of the contact pad, wherein a second portion of the contact pad remains exposed;
a polymer layer on the passivation layer and a third portion of the contact pad, wherein a fourth portion of the contact pad remains exposed;
a post passivation interconnect (PPI) line on the polymer layer in contact with the fourth portion of the contact pad;
a PPI pad on the polymer layer connected to the PPI line, the PPI pad made of a conductive material comprising a solid part surrounding a hollow part, the solid part having an opening connected to the hollow part, wherein the PPI pad has a top-most surface and the PPI line has a top-most surface substantially co-planar with the top-most surface of the PPI pad; and
a solder ball over the hollow part of the PPI pad and in contact with the PPI pad.

* * * * *